(12) United States Patent
Cao et al.

(10) Patent No.: US 7,646,604 B2
(45) Date of Patent: Jan. 12, 2010

(54) HEAT DISSIPATION DEVICE HAVING A FAN MOUNTED THEREON

(75) Inventors: Jun Cao, Shenzhen (CN); Peng Liu, Shenzhen (CN); Shi-Wen Zhou, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 263 days.

(21) Appl. No.: 11/767,040

(22) Filed: Jun. 22, 2007

(65) Prior Publication Data

US 2008/0316705 A1    Dec. 25, 2008

(51) Int. Cl.
*H05K 7/20*  (2006.01)
*G06F 1/20*  (2006.01)

(52) U.S. Cl. ............. 361/697; 361/679.47; 361/679.48; 361/679.54; 361/695; 361/704; 361/709; 165/80.3; 174/16.1; 174/16.3; 415/213.1

(58) Field of Classification Search ................................ 361/679.46–679.49, 679.52–679.54, 690, 361/694–695, 697–799; 165/80.3–80.5, 165/104.33, 185; 174/15.2, 16.1, 16.3; 415/213.1
See application file for complete search history.

(56) References Cited

U.S. PATENT DOCUMENTS

| | | | |
|---|---|---|---|
| 5,788,566 A * | 8/1998 | McAnally et al. | ........... 454/184 |
| 6,330,905 B1 * | 12/2001 | Lin et al. | ................... 165/80.3 |
| 6,351,380 B1 * | 2/2002 | Curlee et al. | ................. 361/695 |
| 6,826,048 B1 * | 11/2004 | Dean et al. | ................... 361/695 |
| 6,894,898 B2 * | 5/2005 | Liu | ............................. 361/697 |
| 6,935,410 B2 * | 8/2005 | Lee et al. | .................... 165/80.3 |
| 7,365,979 B2 * | 4/2008 | Lee et al. | .................... 361/697 |
| 2007/0097632 A1 * | 5/2007 | Lee et al. | .................... 361/695 |
| 2007/0256813 A1 * | 11/2007 | Ho | ............................. 165/80.3 |
| 2008/0041561 A1 * | 2/2008 | Zhou et al. | ................. 165/80.3 |
| 2008/0314556 A1 * | 12/2008 | Zhou et al. | ................. 165/80.3 |

FOREIGN PATENT DOCUMENTS

CN           2414241 Y       1/2001

* cited by examiner

*Primary Examiner*—Jayprakash N Gandhi
*Assistant Examiner*—Robert J Hoffberg
(74) *Attorney, Agent, or Firm*—Frank R. Niranjan

(57) ABSTRACT

A heat dissipation device for at least a heat-generating electronic component includes a heat sink, a fan for providing an airflow through the heat sink and a fan holder coupling the fan to the heat sink. The heat sink has a first locking part and a second locking part opposite to the first locking part. The fan holder has a first engaging part engaging with the first locking part at one side of the heat sink and a second engaging part engaging with the second locking part of the heat sink at an opposite side thereof. The first engaging part has a horizontally extending fixing arm and a barb extending downwardly from the fixing arm and hooking with a top side of the heat sink.

14 Claims, 5 Drawing Sheets

HEAT DISSIPATION DEVICE HAVING A FAN MOUNTED THEREON

BACKGROUND OF THE INVENTION

1. Field of the Invention

The present invention relates generally to a heat dissipation device, and more particularly to a heat dissipation device having a heat sink and a fan holder for facilitating mounting of a fan on the heat sink.

2. Description of Related Art

Generally, in order to ensure the normal running of an electronic device, a heat dissipation device is used to dissipate heat generated by the electronic device. A conventional heat dissipation device includes a heat sink and a fan attached on the heat sink to improve a heat-dissipation capacity of the heat sink.

When installing the fan to the heat sink, it is generally to fix the fan to a side of the heat sink via a fan holder with screws. Although using the screws can achieve the fastening objective, it requires a lot of manpower and material resource. Furthermore, it is necessary to remove the fan first by unscrewing the screws when disassembling and maintaining the heat dissipation device. Such unscrewing operation is tiresome for a user. In addition, it is also possible that the unscrewed screws may fall into a computer in which the heat dissipation device is mounted to cause damages to components of the computer.

What is need therefore is a heat dissipation device having a design which makes assembling and disassembling of a fan to/from a heat sink of the heat dissipation device be convenient and easy.

SUMMARY OF THE INVENTION

The present invention relates to a heat dissipation device for dissipating heat generated by a heat-generating electronic component. The heat dissipation device includes a heat sink, a fan for providing airflow through the heat sink and a fan holder coupling the fan to the heat sink. The heat sink has a first locking part and a second locking part opposite to the first locking part of the heat sink. The fan holder has a first engaging part engaging with the first locking part at one side of the heat sink and a second engaging part engaging with the second locking part at an opposite side of the heat sink.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present device can be better understood with reference to the following drawings. The components in the drawings are not necessarily drawn to scale, the emphasis instead being placed upon clearly illustrating the principles of the present device. Moreover, in the drawings, like reference numerals designate corresponding parts throughout the several views.

DETAILED DESCRIPTION OF THE INVENTION

Figure 1:
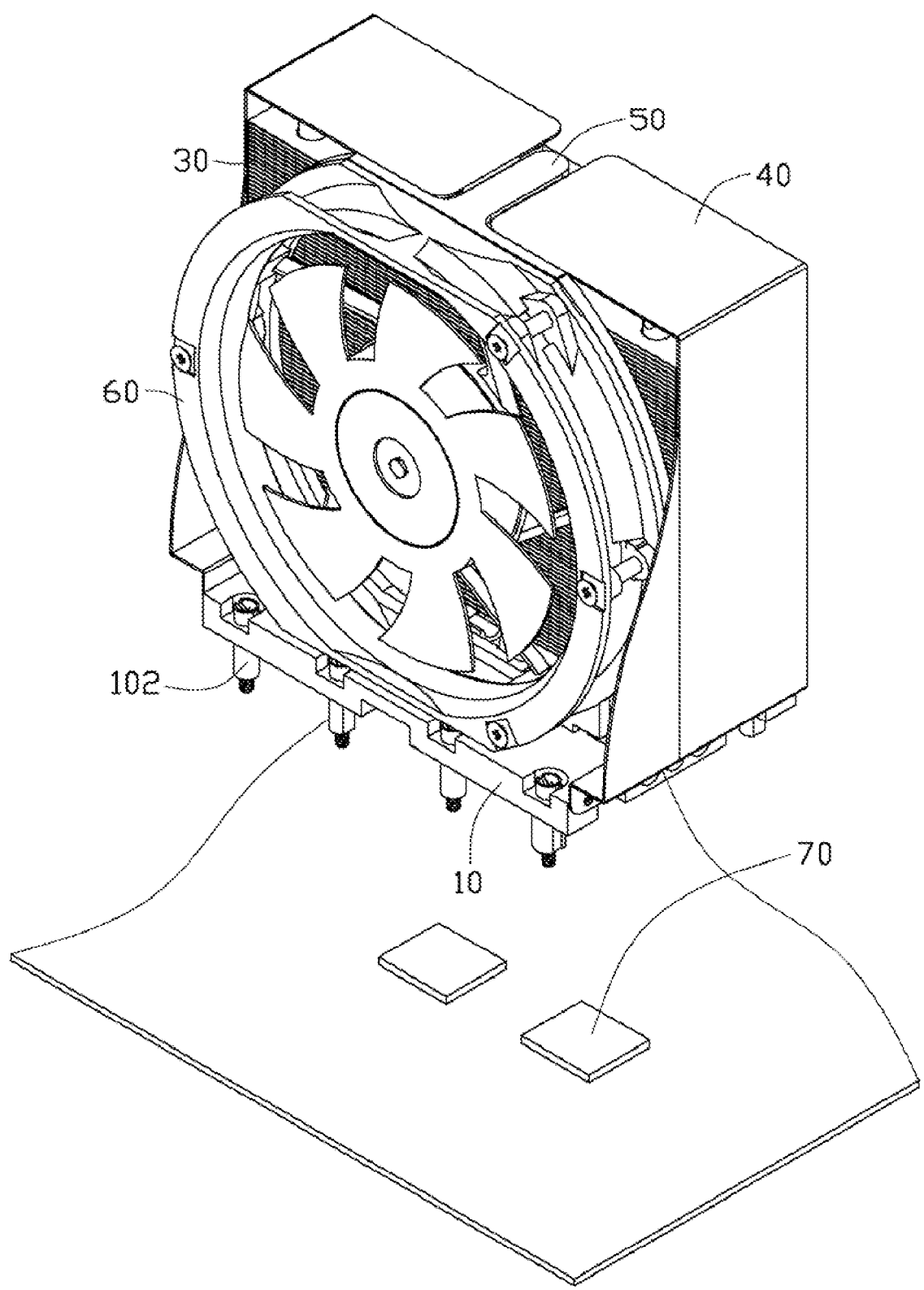
FIG. 1 is an assembled view of a heat dissipation device in accordance with a preferred embodiment of the present invention.
Figure 2:
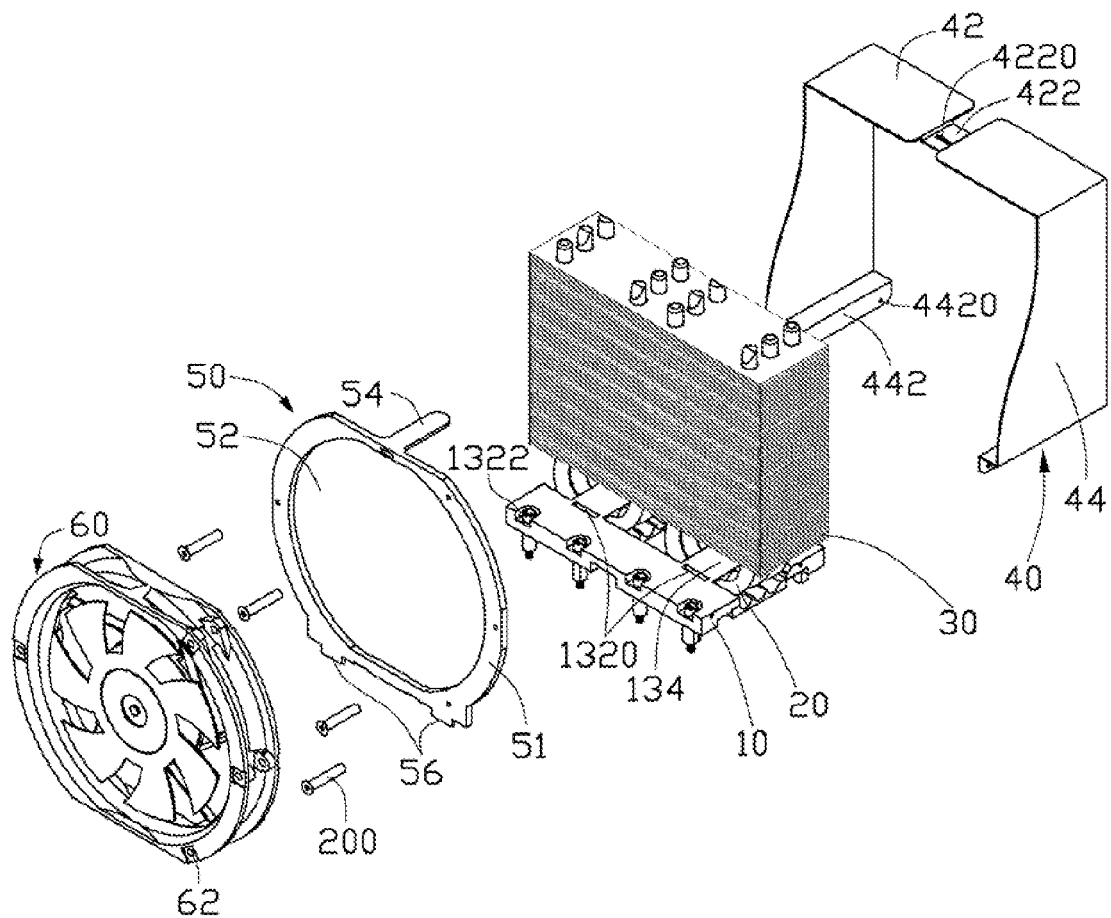
FIG. 2 is an exploded, isometric view of FIG. 1.
Figure 3:
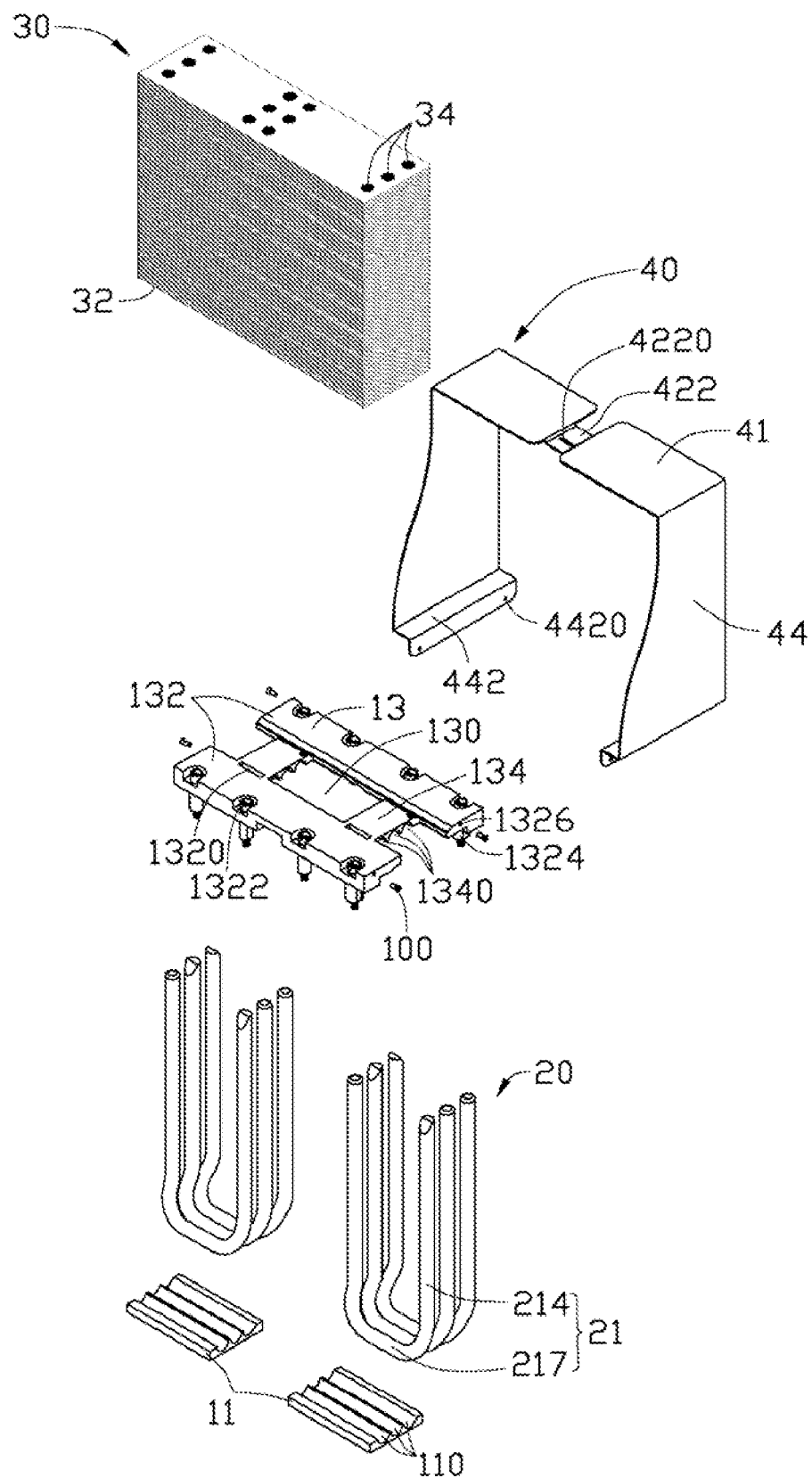
FIG. 3 is an exploded, isometric view of a heat sink of the heat dissipation device of FIG. 2.

Referring to FIGS. 1-3, a heat dissipation device in accordance with a preferred embodiment of the present invention is shown. The heat dissipation device is used to be mounted to two heat-generating electronic elements 70, to dissipate heat therefrom. The heat dissipation device comprises a heat sink, a fan holder 50 secured at a front side of the heat sink and a fan 60 attached to the fan holder 50.

The heat sink comprises a base 10, a fin set 30 located on the base 10, a heat pipe assembly 20 thermally connecting the base 10 and the fin set 30 and a fin cover 40 covering top and two opposite lateral sides of the fin set 30.

The base 10 comprises a supporting frame 13 and two plates 11 attached to a bottom of the supporting frame 13 for contacting with the two corresponding heat-generating electronic elements 70. Each of the plates 11 is made of good conductive material such as copper, and is rectangular in shape and defines three parallel receiving, grooves 110 in a top surface thereof. The supporting frame 13 comprises two spaced and parallel shoulders 132 and two spaced and parallel bridges 134 connecting the two shoulders 132 together. The bridges 134 are perpendicular to the shoulders 132. The supporting frame 13 is provided with a first locking part for engaging with the fan holder 50. In this embodiment, the first locking part is two fixing slots 1320 parallel to the shoulders 132. The two fixing slots 1320 are defined in two joints of the two bridges 134 with one of the shoulders 132 for engaging with the fan holder 50. A plurality of countersinks 1322 are defined in the shoulders 132, adjacent to two remote edges thereof, for receiving fixtures 102 to attach the heat sink onto the heat-generating electronic elements 70. The two shoulders 132 are respecetively provided with two step portions 1324 that face to each other, for receiving the plates 11 under the frame 13. Each of the shoulder 132 defines two mounting orifices 1326 in two opposite lateral ends thereof. for engaging with screws 100 to secure the fin cover 40 to the base 10, The two bridges 134 define a rectangular opening 130 therebetween. Two cutoffs (not labeled) are defined beside the bridges 134, respectively, and between the shoulders 132. Each of the bridges 134 defines three parallel receiving grooves 1340 in a bottom surface thereof corresponding to the receiving grooves 110 of the plates 11.

The heat pipe assembly 20 includes two groups of heat pipe, each having three heat pipes 21. Each of the heat pipes 21 is U-shaped in profile and comprises an evaporating section 217, two parallel condensing sections 214 perpendicular to the evaporating section 217 and two curved connecting sections (not labeled) extending from two opposite ends of the evaporating section 217 and connecting the evaporating section 217 with corresponding condensing sections 214.

The fin set 30 comprises a plurality of fins 32 and defines four spaced and parallel rows of receiving holes 34 for receiving the condensing sections 214 of the heat pipes 21. Two rows of the receiving holes 34 are defined in a middle portion of the fin set 30, and the other two rows of me receiving holes 34 are defined in two lateral portions of the fin set 30, respectively. Each row of the receiving holes 34 includes three receiving holes 34 vertically extending through the fin set 30. Each tin 32 is made of a rectangular metallic plate.

The fin cover 40 is integrally made of a piece of metal sheet and comprises a rectangular top panel 42 and two sidewalls 44 extending perpendicularly and downwardly from two lateral opposite edges of the top panel 42. The top panel 42 is provided with a second locking part at a middle portion thereof, for securing the fan holder 50 to the fin cover 40. In this embodiment, the second locking part is a connecting sheet 422 recessing from a top surface of the top panel 42. The connecting sheet 422 defines a locking orifice 4220 therein, for engaging with the fan holder 50. Due to the recessing of the connecting sheet 422, the top panel 42 forms a concave portion in a middle thereof. The connecting sheet 422 has a width less than that of other portion of the top panel 42. The two sidewalls 44 are constructed to be disposed snugly on the two opposite lateral sides of the fin set 30. The two sidewalls 44 each have a width increasing gradually in a same direction from a top to a bottom thereof. A bottom end of each of the sidewalls 44 is bent inwardly and perpendicularly, then further downwardly and perpendicularly to form a mounting leg 442. Each of the mounting legs 442 defines two fixing orifices 4420 adjacent to two opposite ends thereof, for allowing the screws 100 to extend therethrough to screw into the mounting orifices 1326 of the base 10.

Particularly referring to FIG. 2, in assembly of the heat sink, the evaporating sections 217 of two groups of the heat pipes 21 are sandwiched between the two respective plates 11 and the two corresponding bridges 134 of the supporting frame 13 and received respectively in channels formed cooperatively by the receiving grooves 110, 1340 of the two plates 11 and the bridges 134 of the supporting frame 13; the condensing sections 214 of two groups of the heat pipes 21 are engagingly received in the receiving holes 34 of the fin set 30, respectively; thus, the base 10 and fin set 30 are thermally connected together by the heat pipes 21. The fin cover 40 covers on the fin set 30 and is secured to the base 10 by the screws 100 extending through the corresponding fixing orifices 4420 of the mounting legs 442 of the sidewalls 44 to screw into the mounting orifices 1326 of the base 10.

It can be easily understood in some embodiment, the fin cover 40 can be omitted. Correspondingly, a top fin 32 of the fin set 30 defines a locking orifice replacing the locking orifice 4220 of the fin cover 40 to engage with the fan holder 50.

Figure 4:
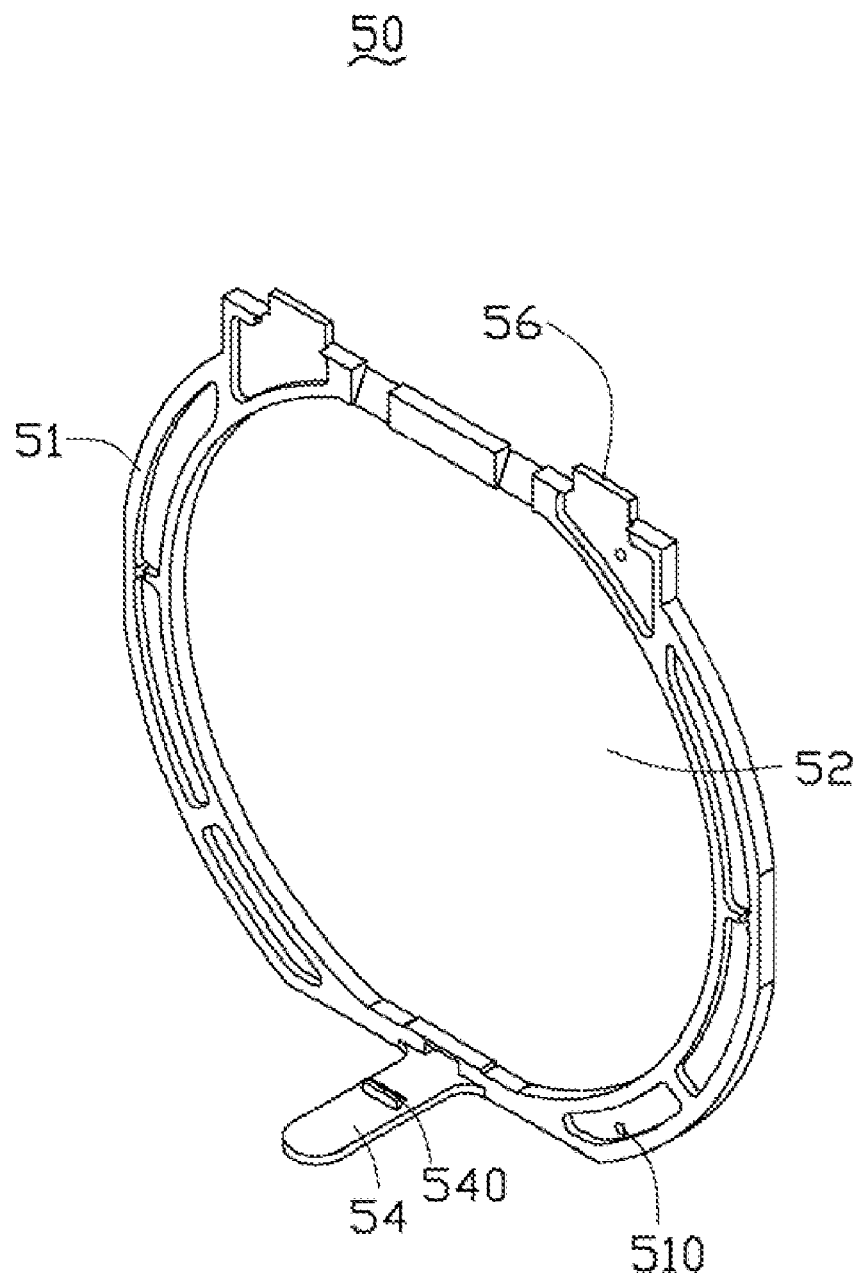
FIG. 4 is an inverted view of a fan holder of the heat dissipation device of FIG. 2.
Figure 5:
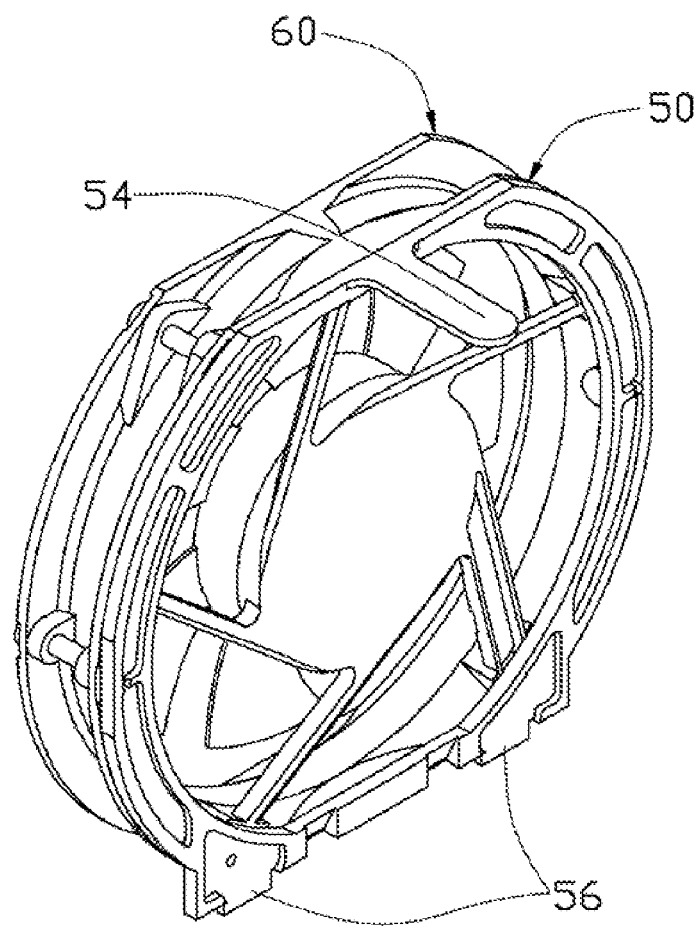
FIG. 5 is an assembled view of the fan holder with a fan of the heat dissipation device of FIG. 2.

As shown in FIG. 4, the fan holder 50 is formed by molded plastic material and substantially ring-shaped. The fan holder 50 has a ring body 51 with a through hole 52 therein for allowing air flow generated by the fan 60 to pass through the fan holder 50. The ring body 51 defines a plurality of engaging orifices 510 therein for engaging with corresponding fixtures 200 to attach the fan 60 onto the fan holder 50. The fan holder 50 is provided with a first engaging part at an upper edge of the ring body 51 and a second engaging part at a lower edge of the ring body 51 opposite to the upper edge. In this embodiment, the first engaging part is a fixing arm 54 that extends perpendicularly and rearwards from a top of the ring body 51. The fixing arm 54 has a barb 540 extending downwardly form a middle of a bottom surface thereof and matching with the locking orifice 4220 of the fin cover 40. The second engaging part is two inhibiting tabs 56 protruding downwardly from a bottom of the ring body 51 for engaging into the fixing slots 1320 of the base 10.

The fan 60 has a frame (not labeled) with a shape and size corresponding to that of the fan holder 50. The frame defines a plurality of through orifices 62 (FIG. 2) corresponding to the engaging orifices 510 of the fan holder 50, for receiving the fixtures 200.

In assembly of the heat dissipation device, the fan holder 50 and the fan 60 are assembled into a fan assembly by the fixtures 200 extending through the through orifices 62 of the fan 60 to engage into the engaging orifices 510 of the fan holder 50. The fixing arm 54 of the fan holder 50 of the fan assembly is disposed in the concave portion of the fin cover 40 and supported by the connecting sheet 422 of the fin cover 40 with the barb 540 of the fixing arm 54 aligned with the locking orifice 4220 of the fin cover 40. The fan holder 50 of the fan assembly is then pressed downwardly to force the barb 540 of the fixing arm 54 to be interferentially fitted into the locking orifice 4220 of the fin cover 40. As soon as the barb 540 of the fixing arm 54 fits in the locking orifice 4220 of the fin cover 40, the barb 540 hooks with the connecting sheet 422 of the fin cover 40. When the barb 540 is engaged into the locking orifice 4220 of the fin cover 40, the two inhibiting tabs 56 at the bottom of the fan holder 50 of the fan assembly are forced to be engagingly inserted into the two corresponding fixing slots 1320 of the frame 13 of the base 10. The fan 60 combined with the fan holder 50 is thus mounted to the heat sink securely and easily. To detach the fan assembly from the heat sink, a user only needs to pull the fixing arm 54 upwardly by hand to release the hooked connection between the barb 540 and the connecting sheet 422; then the fan assembly can be pulled away from the heat sink easily.

According to aforementioned description, assembling and disassembling of the fan assembly consisting of the fan 60 and the fan holder 50 to/from the heat sink can be easily and simply completed by the user using his (her) hands, without requiring any special tool to rotate a plurality of screws.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device adapted for dissipating heat from at least a heat-generating electronic component, comprising:

a heat sink for absorbing the heat from the at least a heat-generating electronic component, having a first locking part and a second locking part opposite to the first locking part;

a fan for providing an airflow through the heat sink; and a fan holder to which the fan is mounted, coupling the fan to the heat sink and having a first engaging part engaging with the first locking part of the heat sink at one side thereof, and a second engaging part engaging with the second locking part of the heat sink at an opposite side thereof, the first engaging part being interferentially fitted in the first locking part;

wherein the heat sink comprises a base, and the second locking part is at least a fixing slot formed in the base; and wherein the heat sink further comprises a fin cover, and the first locking part is formed in a top surface of the fin cover.

2. The heat dissipation device of claim 1, wherein the heat sink further comprises a fin set located on the base and having a plurality of fins, and the fin cover surrounds the fin set and has the first locking part located above the fin set.

3. The heat dissipation device of 1, wherein the base comprises a supporting frame and at least two spaced plates engaged with the supporting frame, the plates being for contacting with the at least a heat-generating electronic component.

4. The heat dissipation device of 3, wherein the supporting frame of the base comprises two spaced shoulders and at least two spaced bridges connecting the shoulders together.

5. The heat dissipation device of 4, wherein the heat sink further comprises a plurality of heat pipes each having an evaporating section and at least a condensing section, the evaporating sections being sandwiched between the plates of the base and the bridges.

6. A heat dissipation device comprising:
   a heat sink having a bottom portion contacting a heat-generating electronic component;
   a fan holder comprising a ring body having a through hole therein for air flow passing therethrough, at least a fixing arm extending from an upper edge of the ring body and at least an inhibiting tab protruding from a lower edge of the ring body, the at least a fixing arm engaging with a middle of a top portion of the heat sink, the at least an inhibiting tab engaging with the bottom portion of the heat sink; and
   a fan mounted to the fan holder for generating an airflow to the heat sink via the fan holder.

7. The heat dissipation device of 6, wherein the at least a fixing arm of the fan holder is perpendicular to the ring body of the fan holder.

8. The heat dissipation device of 7, wherein the at least a fixing arm of the fan folder has a barb extending downwardly from a bottom surface thereof.

9. The heat dissipation device of claim 8, wherein the heat sink defines at least a locking orifice engaged with the barb in a top surface of the heat sink.

10. The heat dissipation device of 9, wherein the barb hooks with the top face of the heat sink.

11. The heat dissipation device of 7, Wherein the at least an inhibiting tab of the fan holder is vertically inserted into a slot defined in a base of the heat sink.

12. A heat dissipation device comprising:
    a heat sink having a bottom face adapted for contacting with a heat-generating electronic component and a top face defining a slot therein;
    a fan holder having at least a downwardly extending inhibiting tab inserted into a base of the heat sink and a horizontally extending fixing arm extending over the top face of the heat sink, the fixing arm having a downwardly extending barb interferentially fitted into the slot and hooking with the top face of the heat sink; and
    a fan securely attached to the fan holder, for producing an airflow through the heat sink.

13. The heat dissipation device of 12, wherein the heat sink has a fin set and a fin cover covering top and opposite lateral sides of the fin set, the fixing arm being positioned on a top side of the fin cover with the barb of the fixing arm hooking with the top side of the fin cover.

14. The heat dissipation device of claim 13, wherein the base of the heat sink receives a number of fixtures therein, the fix being adapted for fastening the heat dissipation device to the heat-generating electronic component.

* * * * *